United States Patent
Choi

(10) Patent No.: US 9,620,490 B2
(45) Date of Patent: Apr. 11, 2017

(54) FUSE PACKAGE AND LIGHT EMITTING DEVICE MODULE USING THE SAME

(71) Applicant: SAMSUNG ELECTRONICS CO., LTD., Suwon-si (KR)

(72) Inventor: Seung Hwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/971,183

(22) Filed: Dec. 16, 2015

(65) Prior Publication Data
US 2016/0190074 A1 Jun. 30, 2016

(30) Foreign Application Priority Data
Dec. 31, 2014 (KR) .................. 10-2014-0194690

(51) Int. Cl.
| | | |
|---|---|---|
| H01L 23/00 | (2006.01) | |
| H01L 25/16 | (2006.01) | |
| H01L 23/10 | (2006.01) | |
| H01L 23/525 | (2006.01) | |
| H01L 23/62 | (2006.01) | |
| H01L 33/62 | (2010.01) | |

(52) U.S. Cl.
CPC ............ *H01L 25/167* (2013.01); *H01L 23/10* (2013.01); *H01L 23/5256* (2013.01); *H01L 23/62* (2013.01); *H01L 24/05* (2013.01); *H01L 33/62* (2013.01); *H01L 2924/19107* (2013.01)

(58) Field of Classification Search
CPC ..... H01L 23/5256; H01L 23/62; H01L 23/10; H01L 24/05
See application file for complete search history.

(56) References Cited

U.S. PATENT DOCUMENTS

| | | | |
|---|---|---|---|
| 4,773,157 A * | 9/1988 | Galloway ............ | H01H 85/143 174/84 R |
| 5,502,614 A * | 3/1996 | Kuriyama ............ | H01G 9/0003 361/534 |
| 6,255,141 B1 | 7/2001 | Singh et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |

(Continued)

FOREIGN PATENT DOCUMENTS

| | | |
|---|---|---|
| KR | 10-0385225 B1 | 5/2003 |
| KR | 10-2010-0109045 A | 10/2010 |

(Continued)

*Primary Examiner* — Ngan Ngo
(74) *Attorney, Agent, or Firm* — Sughrue Mion, PLLC

(57) ABSTRACT

A fuse package may include a first lead frame, a second lead frame spaced apart from the first lead frame, a package body configured to cover at least a portion of the first lead frame and at least a portion of the second lead frame, a wire fuse mounted on the first lead frame and the second lead frame, and configured to electrically connect the two lead frames, and an encapsulator configured to cover the wire fuse.

20 Claims, 8 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,222,665 B2 | 7/2012 | Weng |
| 8,228,679 B2 | 7/2012 | Shilling et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,405,099 B2 | 3/2013 | Shen |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,642,446 B2 | 2/2014 | Lin et al. |
| 8,735,931 B2 | 5/2014 | Han et al. |
| 8,766,295 B2 | 7/2014 | Kim |
| 8,816,390 B2 | 8/2014 | Marbella et al. |
| 2002/0135055 A1 | 9/2002 | Cho et al. |
| 2007/0280012 A1 | 12/2007 | Obayashi et al. |
| 2010/0140598 A1 | 6/2010 | Paravia et al. |
| 2012/0194077 A1 | 8/2012 | Wei et al. |
| 2013/0051001 A1 | 2/2013 | Miskin |
| 2013/0279272 A1 | 10/2013 | Kim |
| 2014/0217899 A1* | 8/2014 | Kang .......... H05B 33/083 315/122 |
| 2014/0306214 A1 | 10/2014 | Lee et al. |
| 2016/0197468 A1* | 7/2016 | Bandel .......... H02H 3/046 361/118 |

FOREIGN PATENT DOCUMENTS

| | | |
|---|---|---|
| KR | 10-2011-0001694 A | 1/2011 |
| KR | 10-2011-0137060 A | 12/2011 |
| KR | 10-2012-0088586 A | 8/2012 |
| KR | 10-1316280 B1 | 10/2013 |
| KR | 10-2013-0135184 A | 12/2013 |
| KR | 10-1421415 B1 | 7/2014 |

* cited by examiner

A-A'

FUSE PACKAGE AND LIGHT EMITTING DEVICE MODULE USING THE SAME

CROSS-REFERENCE TO RELATED APPLICATION

This application claims priority from Korean Patent Application No. 10-2014-0194690, filed on Dec. 31, 2014, with the Korean Intellectual Property Office, the disclosure of which is incorporated herein in its entirety by reference.

TECHNICAL FIELD

Apparatuses consistent with exemplary embodiments relate to a fuse package and a light emitting device module using the same.

BACKGROUND

A semiconductor light emitting device, such as a light emitting diode (LED), is a device which emits light when electrical energy is applied thereto. In the semiconductor light emitting device, energy is generated when electrons and holes are combined at junctions between semiconductor layers, and the energy is converted to light such that the light is emitted. The light emitting diode is widely used in lighting devices, display devices, and illumination devices, and has been rapidly developed.

In particular, as the development and the use of light emitting diodes (e.g. gallium nitride semiconductors) has expanded in areas of, for example, cell phone keypads, vehicle lamps, camera flashes, and the like, lighting devices using the light emitting diodes have been actively developed. As light emitting diodes that are used as light sources in devices such as automobile headlights and backlight units of big-screen televisions (TVs) have an increased size, as well as being increased in both capacity and efficiency, there is an increasing need for a high-quality light emitting diode with improved characteristics.

As light emitting diodes are widely used, the use of light emitting device modules having a plurality of light emitting diodes disposed therein to increase the amount of light emitted therefrom has increased. However, when a stable supply of electricity is not provided, a light emitting diode may be damaged due to an unstable power supply. In this case, a light emitting device module having a plurality of light emitting diodes therein may be entirely damaged. Thus, a method of preventing light emitting device modules from being damaged is needed.

SUMMARY

One or more exemplary embodiments provide a method of preventing a light emitting device module from being damaged.

According to an aspect of an exemplary embodiment, a fuse package may include a first lead frame, a second lead frame spaced apart from the first lead frame, a package body configured to cover at least a portion of the first lead frame and at least a portion of the second lead frame, a wire fuse mounted on the first lead frame and the second lead frame, and configured to electrically connect the two lead frames, and an encapsulator configured to cover the wire fuse.

The fuse package may further include a light emitting diode chip mounted on the package body and electrically connected to the wire fuse in series.

The wire fuse may include a material containing at least one selected from a group consisting of gold (Au), silver (Ag), and copper (Cu).

According to an aspect of another exemplary embodiment, a light emitting device module may include a light emitting device string, including a plurality of light emitting device packages that are electrically connected in series, and a fuse package connected to the light emitting device string in series, wherein the fuse package includes a first lead frame, a second lead frame spaced apart from the first lead frame, a package body configured to cover at least a portion of the first lead frame and at least a portion of the second lead frame, a wire fuse mounted on the first lead frame and the second lead frame, and configured to electrically connect the first lead frame and the second lead frame, and an encapsulator configured to cover the wire fuse.

The wire fuse may be wire bonded to the first lead frame and the second lead frame.

The fuse package may be connected to an input terminal of the light emitting device string.

The light emitting device module may further include a light emitting diode chip mounted on the package body and electrically connected to the wire fuse in series.

The encapsulator may include a material configured to convert a wavelength of light.

The wire fuse may include a material containing at least one selected from a group consisting of gold (Au), silver (Ag), and copper (Cu).

The plurality of light emitting device packages may include flip chip packages.

The encapsulator may include a light transmitting material.

The encapsulator may include a material configured to convert a wavelength of light.

The wire fuse may be wire bonded to the first lead frame and the second lead frame.

The wire fuse may have a thickness ranging from about 0.8 mil to about 1.0 mil.

The wire fuse may have a length ranging from about 500 μm to about 800 μm.

According to an aspect of still another exemplary embodiment, a lighting apparatus may include a light emitting device module; and a body configured to accommodate the light emitting device module, wherein the light emitting device module includes a circuit board on which a fuse package and a plurality of light emitting device packages are mounted, the fuse package and the plurality of light emitting device packages being electrically connected, wherein the fuse package including a wire fuse configured to be blown in response to a current having a predetermined current value or more being applied thereto.

The light emitting device module may include a string of the plurality of light emitting device packages that are connected to one another in series, wherein the fuse package is connected in series to an input terminal of the light emitting device string.

The fuse package may include a first lead frame; a second lead frame spaced apart from the first lead frame; a package body configured to cover at least a portion of the first lead frame and at least a portion of the second lead frame; a wire fuse mounted on the first lead frame and the second lead frame, and configured to electrically connect the first lead frame and the second lead frame; and an encapsulator configured to cover the wire fuse.

At least a portion of the wire fuse may have an interval of about 140 μm to about 150 μm from the first lead frame and the second lead frame.

The encapsulator may include a transparent liquid resin, the transparent liquid resin including a resin selected from a group consisting of a silicone-based resin, an epoxy-based resin, an acryl-based resin, a polymethyl methacrylate (PMAA) resin, and a mixture thereof.

BRIEF DESCRIPTION OF DRAWINGS

The above and/or other aspects will be more apparent by describing certain example embodiments with reference to the accompanying drawings.

DETAILED DESCRIPTION

Figure 1:
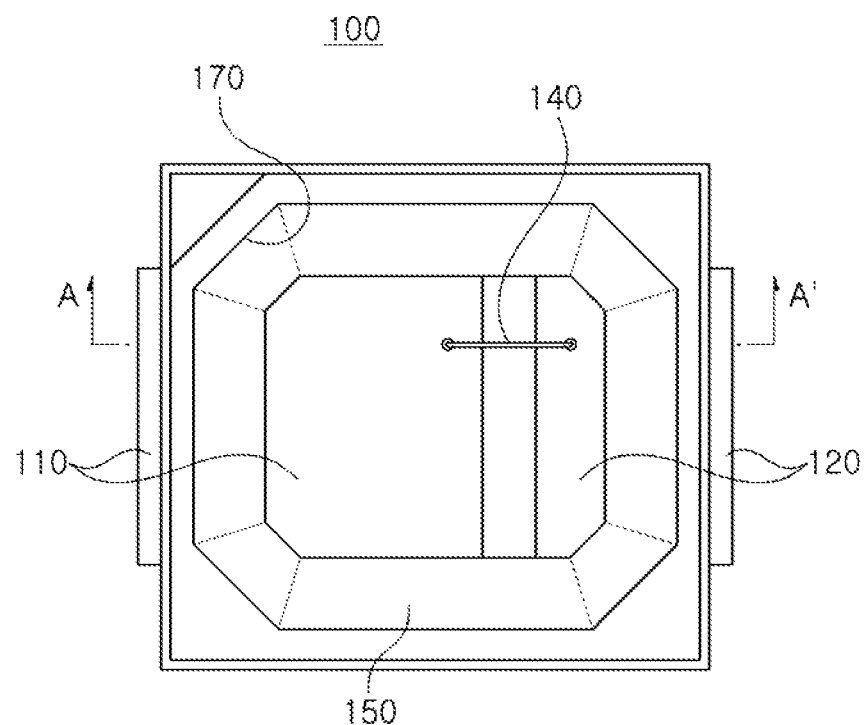
FIG. 1 is a schematic plan view of a fuse package according to an exemplary embodiment.

Various embodiments will now be described more fully with reference to the accompanying drawings in which some embodiments are shown. The present disclosure may, however, be embodied in different forms and should not be construed as limited to the embodiments set forth herein. Rather, these exemplary embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
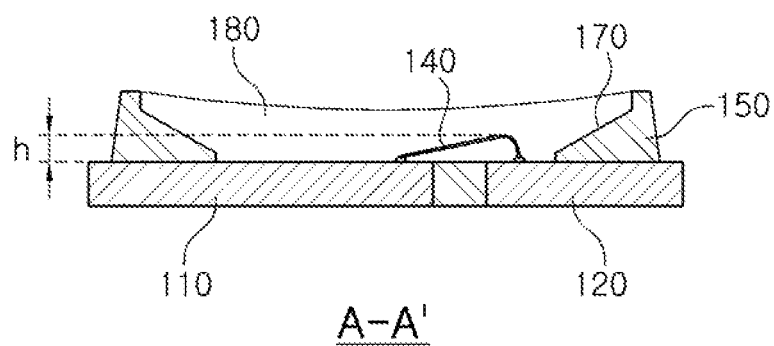
FIG. 2 is a cross-sectional view of the fuse package taken along line A-A' of FIG. 1.

FIG. 1 is a plan view of a fuse package 100 according to an exemplary embodiment, and FIG. 2 is a cross-sectional view of the fuse package 100 taken along line A-A' of FIG. 1.

As illustrated in FIG. 1 and FIG. 2, the fuse package 100 may include a first lead frame 110, a second lead frame 120, a package body 150, a wire fuse 140 electrically connecting the first lead frame 110 and the second lead frame 120 to each other, and an encapsulator 180 covering the wire fuse 140.

The package body 150 may be formed by molding an insulating resin in portions of the first lead frame 110 and the second lead frame 120. The package body 150 may include a recess 170 formed in a portion thereof to have inclined side surfaces, and portions of the first lead frame 110 and the second lead frame 120 may be exposed to bottom portions of the recess 170. The wire fuse 140 may be mounted on the exposed portions of the first lead frame 110 and the second lead frame 120.

The first lead frame 110 and the second lead frame 120 may be formed of base substrate and disposed to be spaced apart from each other in the package body 150. The first lead frame 110 and the second lead frame 120 may have an area on which the wire fuse 140 is mounted. The areas of the first lead frame 110 and the second lead frame 120 on which the wire fuse 140 is mounted may be flat to facilitate the mounting of a light emitting diode chip thereon.

The first lead frame 110 and the second lead frame 120 may include metals with high degrees of electrical conductivity, such as copper (Cu), a copper alloy, or an alloy of phosphorus and bronze, but are not limited thereto. Thicknesses of the first lead frame 110 and the second lead frame 120 may vary depending on a rated capacity, a type, and thermal characteristics of the wire fuse 140, and may be in a range between about 0.01 mm to about 2.0 mm.

The wire fuse 140 is mounted to electrically connect the first lead frame 110 and the second lead frame 120 to each other, and may be formed of a conductive substance that melts and blows out in response to a current having a rated current value or more being applied thereto.

The wire fuse 140 may be formed using a conductive wire or one of equivalents thereof and may be bonded to the first lead frame 110 and the second lead frame 120 by a wire bonding device. The conductive wire may be formed using one of gold (Au), silver (Ag), copper (Cu), and alloys thereof. However, the exemplary embodiments are not limited thereto.

The wire fuse 140 may melt in response to a current having a rated current value or more being applied thereto, such that a connection between the first lead frame 110 and the second lead frame 120 is electrically opened. A rated current or more may be generated due to electrical overstress (EOS) such as a surge occurring in an electrical power source.

The EOS may not be blocked by a Zener diode generally provided in a light emitting device package. The Zener diode, which provides protection against electrostatic discharge (ESD), may be degraded and damaged when the EOS occurs. Therefore, an additional protective device to block the EOS is needed.

When a current having a rated current value or more is applied to the fuse package 100 due to the EOS, the wire fuse 140 may melt to electrically open the fuse package 100. Thus, the light emitting device package electrically connected to the fuse package 100 in series may be protected. A detailed description thereof will be provided later.

Here, the current having a rated current value may correspond to a current of about 2 A flowing for about one minute. The wire fuse 140 may be designed to melt and be electrically opened when the rated current is applied thereto. For example, the wire fuse 140 may be designed to have a thickness ranging from about 0.8 mil to about 1.0 mil and a length ranging from about 500 µm to about 800 µm. In addition, the wire fuse 140 may be disposed so that a portion thereof has a predetermined distance h from the first lead frame 110 and the second lead frame 120 as illustrated in FIG. 2. In a case in which the wire fuse 140 is disposed relatively close to the first lead frame 110 and the second lead frame 120, the melted wire fuse 140 may stick to the first lead frame 110 and the second lead frame 120, which may cause an occurrence of a short-circuit between the first lead frame 110 and the second lead frame 120. Further, in a case in which the wire fuse 140 is disposed relatively close to the first lead frame 110 and the second lead frame 120, it may be difficult to dissipate heat generated by the wire fuse 140. Thus, the wire fuse 140 may melt even when a current less than a rated current value is applied thereto. According to an exemplary embodiment, the above problems may be prevented by disposing the wire fuse 140 to have the predetermined distance h from the first lead frame 110 and the second lead frame 120. For example, the predetermined distance h may range from about 140 µm to about 150 µm.

The encapsulator 180 may be disposed in the recess 170 of the package body 150 to cover the wire fuse 140. The wire fuse 140 may have a very small thickness, and thus, the wire fuse 140 may be easily cut due to an external impact. Therefore, by providing the encapsulator 180 to cover the wire fuse 140, the wire fuse 140 may be protected from an external impact by the encapsulator 180.

The encapsulator 180 may be formed of a transparent liquid resin, such as a resin selected from the group consisting of a silicone-based resin, an epoxy-based resin, an acryl-based resin, a polymethyl methacrylate (PMAA) resin, mixtures thereof and compounds thereof. The encapsulator 180 may be disposed to fill the recess 170 in the package body 150. The encapsulator 180, which is transparent, may be degraded and darkened when the wire fuse 140 melts and is cut. Thus, the encapsulator 180 visually indicates whether the wire fuse 140 is cut.

The fuse package 100 may be manufactured using a lead frame, a conductive wire, handling equipment for a lead frame, and wire bonding equipment, which are used in an existing manufacturing process of a semiconductor device, such that a highly reliable fuse package may be manufactured in a large quantity at a relatively low cost.

Electrical operations of the fuse package 100 will be described with reference to comparative examples. FIG. 8A to FIG. 8D are plan views illustrating circuit operations in the comparative examples when a surge is applied.

Figure 8A:
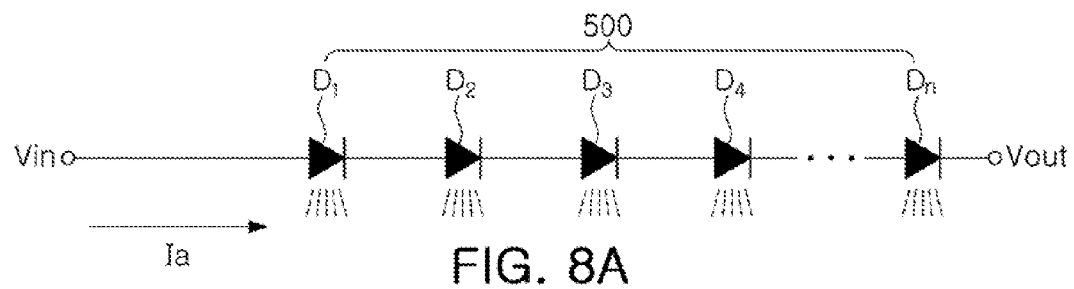
FIGS. 8A to 8D are views illustrating operational states of a circuit when a surge is applied to light emitting device modules of comparative examples.

FIG. 8A is a view illustrating states in which respective light emitting device packages D1, D2, D3, D4, . . . Dn are turned on when a current Ia is applied to a light emitting device string 500 employing the light emitting device packages D1 to Dn having an epi-up structure according to the related art.

In a case in which an EOS such as a surge is applied to the light emitting device string 500 with a configuration as described above, the light emitting device packages D1 to Dn may be short-circuited or electrically opened. While the short-circuits or open circuits may occur in all of the light emitting device packages D1 to Dn simultaneously, the short-circuits or open circuits may occur in a light emitting device package relatively most vulnerable to the EOS. In an exemplary embodiment, for example, the light emitting device package D2 is assumed to be most vulnerable to the EOS.

Figure 8B:
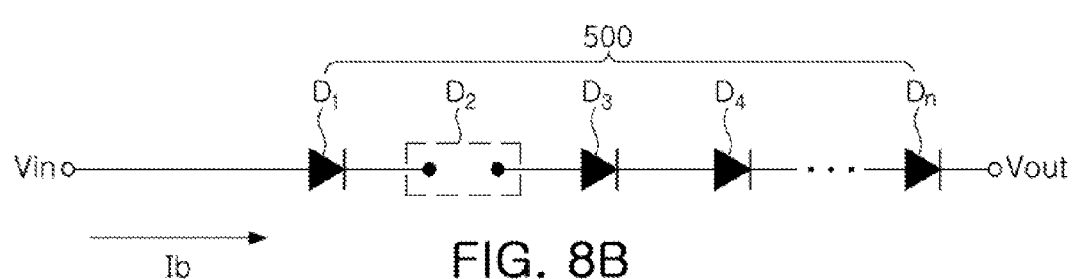

Referring to FIG. 8B, in a case in which an EOS Ib is applied to the light emitting device string 500, a wire that is bonded to a light emitting diode chip of the light emitting device package D2 having an epi-up structure melts and are cut. Thus, the light emitting device package D2 is electrically opened. Also, as in FIG. 8C, in a case in which an EOS Ic is applied to the light emitting device string 500, a melted wire may connect an input terminal and an output terminal of the light emitting device package D2, thereby causing electrical short-circuits in the light emitting device package D2.

Thus, in a case in which an EOS is applied to the light emitting device string 500 employing the light emitting device packages D1 to Dn having an epi-up structure according to the related art, the light emitting device package D2 that is most vulnerable to the EOS may be electrically opened or short-circuited. In the case that the light emitting device package D2 is electrically opened, the light emitting device string 500 is turned off because the current Ib is blocked and is not applied to the light emitting device string 500. Although the light emitting device string 500 is not turned on, the remaining light emitting device packages D1, D3 to Dn are not damaged. Thus, in a case in which the damaged light emitting device package D2 is replaced, the light emitting device string 500 may operate normally.

Figure 8C:
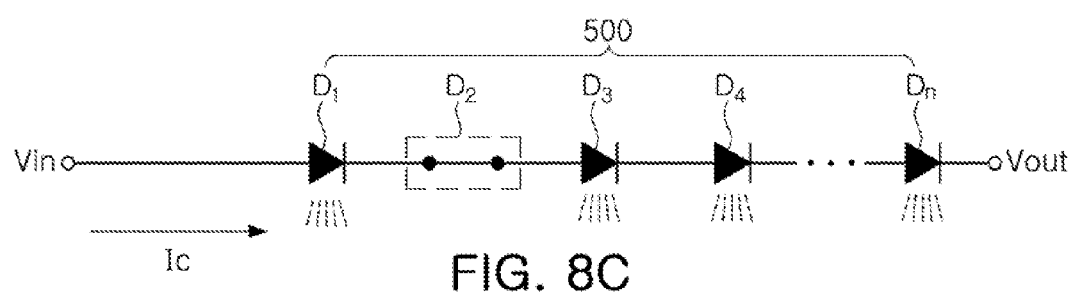
Figure 8D:
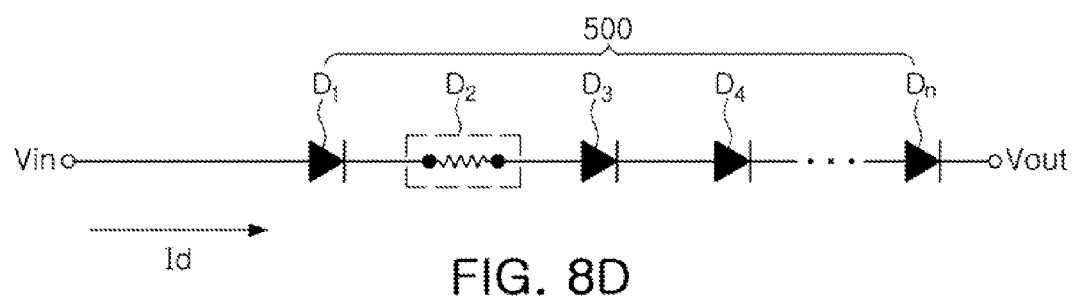

In addition, in a case in which a short-circuit occurs as illustrated in FIG. 8C, the current Ic may be applied to the light emitting device packages D1 and D3 to Dn so that the light emitting device string 500 is turned on. The light emitting device packages D1 and D3 to Dn other than the short-circuited light emitting device package D2 may operate normally.

However, in a case where a flip-chip light emitting diode package is used to increase the amount of emitted light when the EOS is applied thereto, the flip-chip light emitting diode package may operate differently from the epi-up light emitting diode package. A description thereof will be provided with reference to FIG. 8D below.

A flip-chip light emitting device package is mounted directly on a circuit board without a wire bonding process. Thus, in the case in which the EOS is applied to the flip-chip light emitting diode package, short-circuits or open circuits may not occur in the flip-chip light emitting device package because the flip-chip light emitting diode package does not include a wire. Thus, the EOS may be applied to the entirety of the light emitting device string 500, such that a light emitting diode chip in the light emitting device package may be damaged by high voltage. The damaged light emitting diode chip has a relatively high resistance, and an applied voltage Vin is increased since a current supply source (e.g. a switching-mode power supply (SMPS)) applies a constant current to the light emitting device string 500. Here, the applied voltage Vin deteriorates the damaged light emitting diode chip, and thus, the damaged light emitting diode chip may catch fire. In a case in which the damaged light emitting diode chip catches fire, the entirety of the light emitting device string 500 may be damaged, and thus, the light emitting device module or electrical devices (e.g. a television (TV)) equipped with the light emitting device string may be damaged.

Figure 6A:
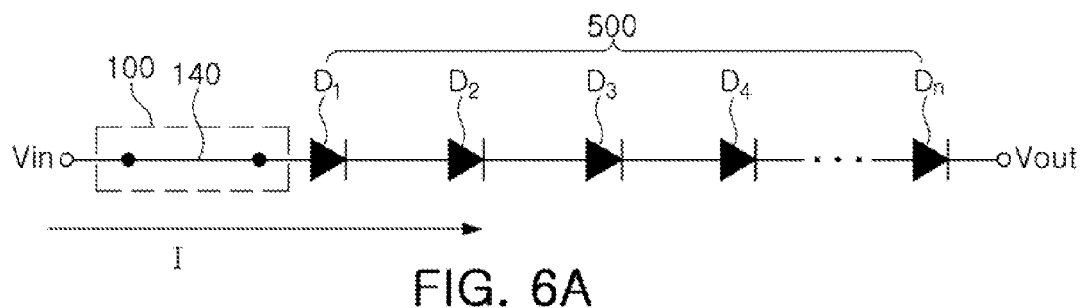
FIGS. 6A and 6B are equivalent circuit diagrams of a light emitting device module including the fuse package of FIG. 1.
Figure 6B:
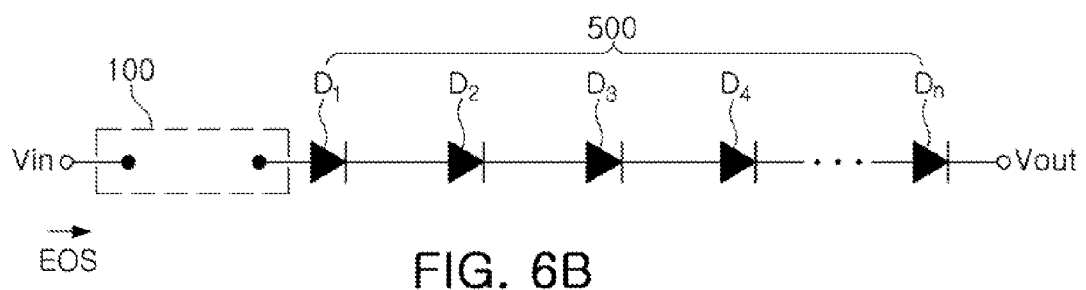
Figure 7:
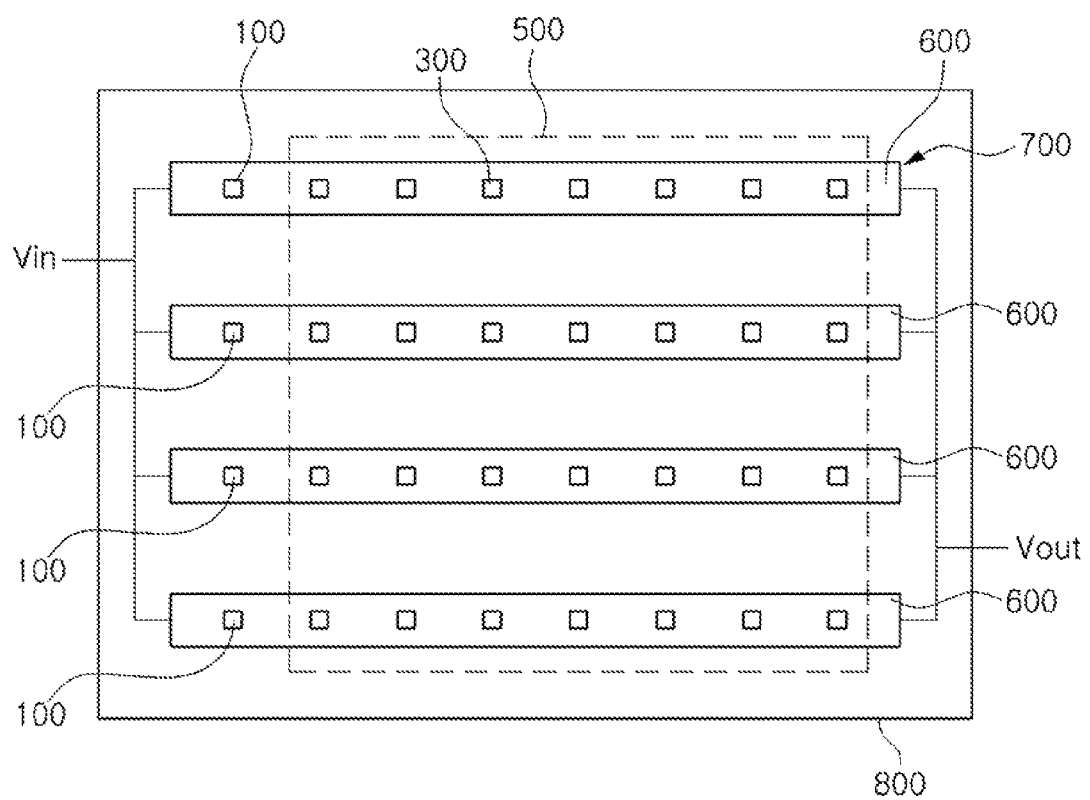
FIG. 7 is an exemplary plan view of a light emitting device module having the fuse package of FIG. 1.

According to the exemplary embodiment, the fuse package 100 may prevent a light emitting diode chip from being damaged by high voltage. The description thereof will be provided with reference to FIG. 6A to FIG. 7. FIG. 6A and FIG. 6B are equivalent circuit diagrams of a light emitting device module employing the fuse package of FIG. 1, and respective light emitting device packages are illustrated as D1 to Dn. FIG. 7 is a schematic plan view of a light emitting device module using the fuse package 100 of FIG. 1.

FIG. 7 illustrates an example in which the fuse packages 100 are disposed in input terminals of a light emitting device string 500 in which light emitting device packages 300 are connected in series, to configure light emitting device modules 700. A reference numeral 600 refers to a circuit board on which the fuse package 100 and the light emitting device packages 300 are mounted, and a reference numeral 800 refers to a chassis structure in which the light emitting device modules 700 are disposed.

The circuit board 600 may have a shape of a bar that is extended in a direction. The circuit boards 600 having the shape of a bar may be arrayed in a width or length direction on the chassis structure 800, to form a backlight unit. As the circuit board 600, for example, a printed circuit board (PCB), a metal core printed circuit board (MCPCB), a metal printed circuit board (MPCB), a flexible printed circuit board (FPCB), and the like may be used. In addition, the circuit board 600 may include a wiring circuit pattern and a connector to transmit and/or receive an electronic signal to and/or from an external source.

As illustrated in FIG. 7, the fuse package 100 may be connected in series to the light emitting device string 500, in which the light emitting device packages 300 are connected in series. The fuse package 100 may be connected to an input terminal of the light emitting device string 500, thereby preventing EOS from being applied to the light emitting device string 500.

Referring to FIG. 6A, when a normal current I is applied, a wire fuse 140 does not melt. Thus, the fuse package 100 may supply the current I to the light emitting device string 500 by operating normally.

Referring to FIG. 6B, when an EOS is applied, the wire fuse 140 melts and is cut, such that the fuse package 100 is electrically opened to block the current from being applied to the light emitting device string 500. Therefore, the light emitting device packages 300 in the light emitting device string 500 may not be damaged by the EOS.

Thus, the fuse package 100 according to an exemplary embodiment may be inserted into the light emitting device module 700, to effectively block the EOS. Further, as described above, the fuse package 100 may be manufactured using an existing manufacturing process of a semiconductor device.

Figure 3A:
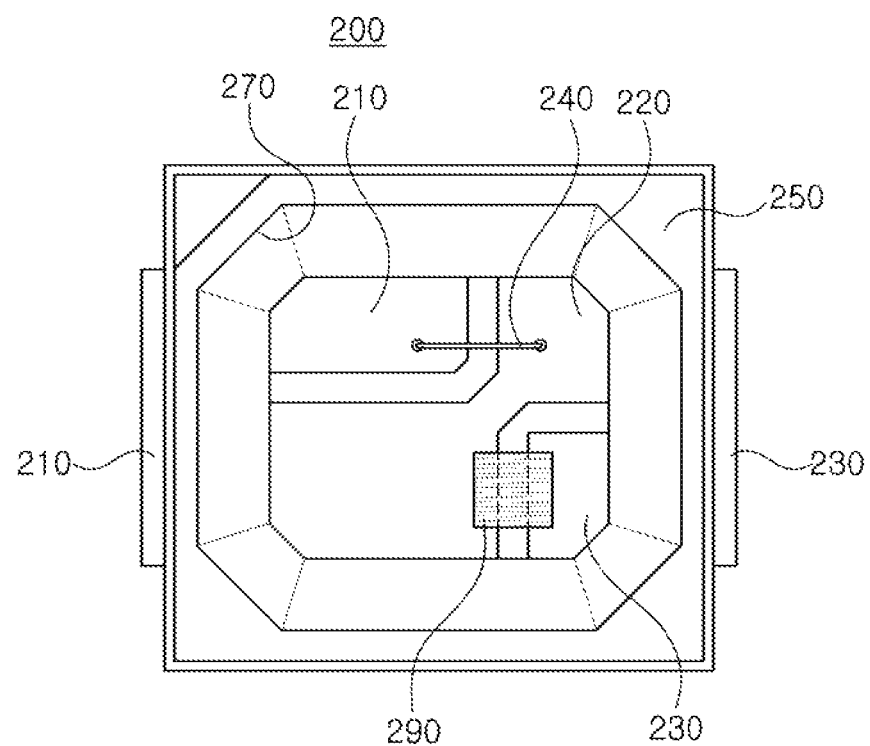
FIG. 3A is a plan view of a fuse package according to another exemplary embodiment.
Figure 3B:
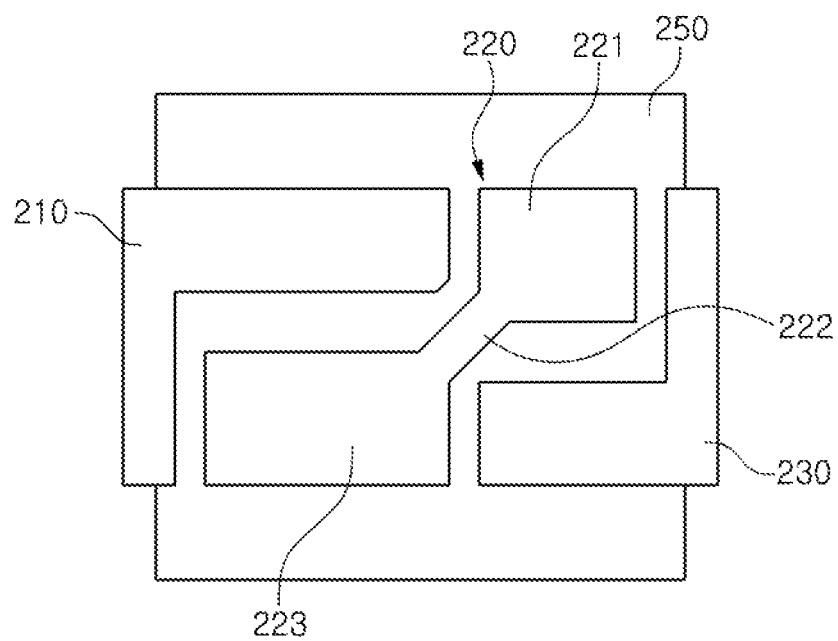
FIG. 3B is a view illustrating disposition of lead frames of FIG. 3A.
Figure 4:
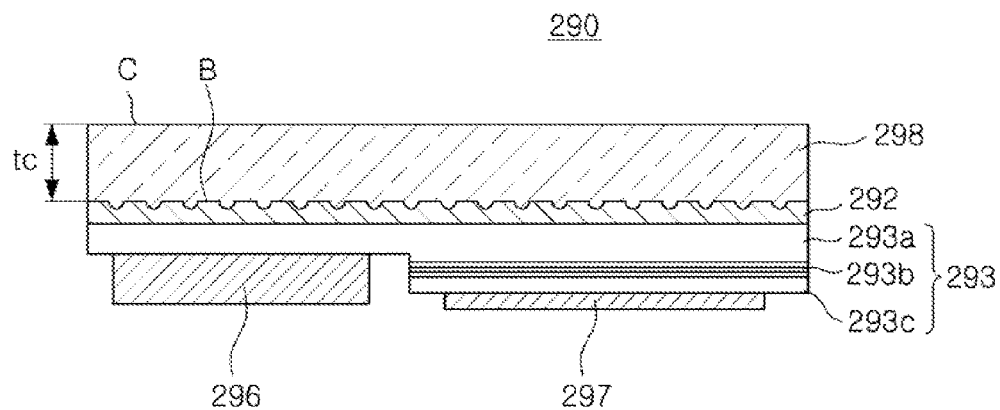
FIG. 4 is a view illustrating a light emitting diode chip of FIG. 3A.
Figure 5:
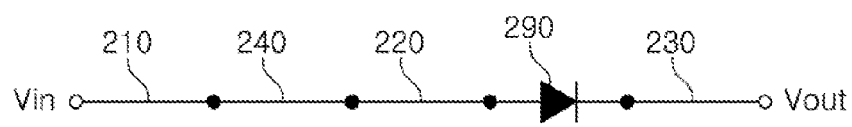
FIG. 5 is an equivalent circuit diagram of the fuse package of FIG. 3A.

Hereinafter, a fuse package 200 according to another exemplary embodiment is described. FIG. 3A is a plan view of a fuse package according to another exemplary embodiment. FIG. 3B is a view illustrating disposition of lead frames of FIG. 3A, FIG. 4 is a view illustrating a light emitting diode chip of FIG. 3A, and FIG. 5 is an equivalent circuit diagram of a fuse package of FIG. 3A.

The exemplary embodiments as shown in FIGS. 3A to 5 is different from the foregoing exemplary embodiments in that a light emitting diode chip 290 is additionally mounted on the fuse package 200. Thus, the following description will be mainly provided with regard to this difference.

Similar to the fuse package 100 according to the foregoing exemplary embodiments, the fuse package 200 according to the exemplary embodiment may include a first lead frame 210, a second lead frame 220, a package body 250, a wire fuse 240 electrically connecting the first lead frame 210 and the second lead frame 220, and an encapsulator covering the wire fuse 240, and may further include a third lead frame 230 and the light emitting diode chip 290.

The light emitting diode chip 290 may be connected to the wire fuse 240 in series. Thus, the fuse package 200 according to an exemplary embodiment may have a structure in which the fuse package 100 and the light emitting device package 300 according to the foregoing exemplary embodiments are combined with each other as a single configuration. Therefore, the fuse package 200 according to an exemplary embodiment may be provided to save a space by combining two packages 100 and 300 into a single package.

The package body 250 may include a recess 270 formed in a portion thereof to have inclined side surfaces, and portions of the first lead frame 210, the second lead frame 220, and the third lead frame 230 may be exposed to bottom portions of the recess 270. The package body 250 and the wire fuse 240 may be similar to or substantially the same as those described above with reference to the foregoing exemplary embodiments, and thus detailed descriptions thereof will be omitted.

Among the first lead frame 210, the second lead frame 220, and the third lead frame 230, the wire fuse 240 may be mounted on the first lead frame 210 and the second lead frame 220, and the light emitting diode chip 290 may be mounted on the second lead frame 220 and the third lead frame 230.

As described in FIG. 3B, the second lead frame 220 may have a first region 221, a second region 222, and a third region 223. The first region 221 may provide a region on which one end terminal of the wire fuse 240 may be mounted, and the third region 223 may provide a region on which one electrode of the light emitting diode chip 290 may be mounted. The second region 222 may connect the first region 221 and the third region 223 to each other such that the wire fuse 240 and the light emitting diode chip 290 may be electrically connected in series.

Referring to FIG. 4, the light emitting diode chip 290 may include a light transmissive substrate 298 having a first surface B and a second surface C, which are disposed to face each other, a light emitting structure 293 disposed on the first surface B of the substrate 298, and a first electrode 296 and a second electrode 297, which are connected to the light emitting structure 293.

As the substrate 298, a substrate for semiconductor growth formed of a material such as sapphire, SiC, MgAl$_2$O$_4$, MgO, LiAlO$_2$, LiGaO$_2$, GaN, and the like may be used. In this case, sapphire is a crystal having a Hexa-Rhombo (Hexa-Rhombo R3c) symmetry, and a lattice constant of 13.001 Å in a c-axis orientation and a lattice constant of 4.758 Å in an a-axis orientation. Here, the sapphire has a C plane (0001), an A plane (11-20), and an R plane (1-102), and the like. In this case, since the C-plane allows a nitride thin film to be relatively easily grown thereon and is stable even at high temperatures, sapphire is widely used as a growth substrate for a nitride.

The substrate 298 may have the first surface B and the second surface C, which are disposed to face each other, and at least one of the first surface B and the second surface C may have uneven portions. The uneven portion may be provided by etching a portion of the substrate 298. Alternatively, the uneven portion may also be provided by forming the uneven portion in a material different from that of the substrate 298.

As illustrated in FIG. 4, when the uneven portion is formed on the first surface B, which is provided as a growth surface of the light emitting structure 293, stress occurring due to the difference between the lattice constants of the substrate 298 and a first conductivity-type semiconductor layer 293a may be decreased. In detail, when a group III nitride-based compound semiconductor layer is grown on a sapphire substrate, a lattice defect such as dislocation may occur due to the difference in lattice constants between the substrate and the group III nitride-based compound semiconductor layer, and the lattice defect may spread to an upper portion of the substrate, thereby deteriorating the crystallinity of the semiconductor layer.

According to an exemplary embodiment, the uneven portion with convex portions is formed on the substrate 298, and the first conductivity-type semiconductor layer 293a is grown on surfaces of the convex portions, such that a dislocation defect may be prevented from spreading to an upper portion of the substrate 298. Therefore, a high-quality light emitting diode package may be provided, and thus, inner quantum efficiency may be improved.

In addition, pathways of light emitted from an active layer 293b may be diversified resulting from an irregular pattern formed on the substrate 298, such that a proportion of the light being absorbed inside the semiconductor layer is decreased, and a proportion of the light scattering is increased, and thus, light extraction efficiency may be increased.

Here, the substrate 298 may have a thickness tc of 100 μm or less. In detail, the substrate 298 may have a thickness ranging from about 1 μm to about 20 μm, but is not limited thereto. This range of thickness may be achieved by polishing a growth substrate provided for a semiconductor growth. In detail, a method of grinding the second surface C disposed to face the first surface B on which the light emitting structure 293 is formed or a method of lapping the second surface C using a lap and lapping powder through grinding and abrasion may be used.

The light emitting structure 293 may include the first conductivity-type semiconductor layer 293a, the active layer 293b, and a second conductivity-type semiconductor layer 293c, which are disposed sequentially on the substrate 298. The first conductivity-type semiconductor layer 293a and the second conductivity-type semiconductor layer 293c may be n-type and p-type semiconductor layers, respectively, and may be configured of a nitride semiconductor. In an exemplary embodiment, the first conductivity-type semiconductor layer 293a and the second conductivity-type semiconductor layer 293c may be understood to refer to an n-type nitride semiconductor layer and a p-type nitride semiconductor layer, respectively, but are not limited thereto. The first conductivity-type semiconductor layer 293a and the second conductivity-type semiconductor layer 293c may have an empirical formula Al$_x$In$_y$Ga$_{(1-x-y)}$N (0≤x<1, 0≤y<1, and 0≤x+y<1), and may include materials such as GaN, AlGaN, InGaN, and AlInGaN.

The active layer 293b may be a layer for emitting visible light having a wavelength ranging from about 350 nm to about 680 nm and may be configured of an undoped nitride semiconductor layer with a single quantum well or multiple quantum well (MQW) structure. For example, the active layer 293b may be formed to have a multiple quantum well in which multiple quantum barrier layers and multiple quantum well layers represented by Al$_x$In$_y$Ga$_{(1-x-y)}$N (0≤x<1, 0≤y<1, and 0≤x+y<1) are alternately laminated, and may have a structure having a predetermined band gap. Due to the quantum well structure, electrons and holes are recombined and emit light. For example, a InGaN/GaN structure may be used for the multiple quantum well structure. The first conductivity-type semiconductor layer 293a, the second conductivity-type semiconductor layer 293c, and the active layer 293b may be formed of a crystal growth process such as metal organic chemical vapor deposition (MOCVD), molecular beam epitaxy (MBE), and hydride vapor phase epitaxy (HVPE), which are commonly used in the art.

A buffer layer 292 may be further disposed between the substrate 298 and the light emitting structure 293. In a case in which the light emitting structure 293 is grown on the substrate 298 or, for example, in a case in which a GaN thin film is grown as the light emitting structure on a heterosubstrate, a lattice defect such as dislocation may occur due to a difference in lattice constants of the substrate and the GaN thin film, and a crack may appear in the light emitting structure because the substrate is bent due to the difference in thermal expansion coefficients between the substrate and the GaN thin film. To prevent such lattice defects and bending from occurring, the buffer layer 292 may be formed on the substrate 298, and a desired light emitting structure such as a nitride semiconductor may be grown on the buffer layer 292. The buffer layer 292 may be a low temperature buffer layer formed at a temperature lower than a growth temperature of a single crystal forming the light emitting structure 293, but is not limited thereto.

The buffer layer 292 may be formed of a material corresponding to $Al_xIn_yGa_{(1-x-y)}N$ ($0 \leq x \leq 1$, $0 \leq y \leq 1$, and $0 \leq x+y \leq 1$), such as GaN, AlN, or AlGaN. For example, the buffer layer 292 may be formed of an undoped GaN layer having a predetermined thickness, but is not limited thereto. Thus, any structure able to improve crystallinity of the light emitting structure 293 may be adopted, and substances like $ZrB_2$, $HfB_2$, ZrN, HfN, TiN, and ZnO may also be used. In addition, a layer in which a plurality of layers are combined or a layer in which a composition is gradually changed may be used.

The first and second electrodes 296 and 297 may be provided to electrically connect the first and second conductivity-type semiconductor layers 293a and 293c to the outside. The first and second electrodes 296 and 297 may contact the first and second conductivity type semiconductor layers 293a and 293c, respectively.

The first electrode 296 and the second electrode 297 may be respectively formed of a conductive material having a single-layer or multi-layer structure and having ohmic contact with the first conductivity-type semiconductor 293a and the second conductivity-type semiconductor 293c respectively. For example, the first electrode 296 and the second electrode 297 may be formed by using a process of depositing or sputtering one or more of Au, Ag, Cu, Zn, Al, In, Ti, Si, Ge, Sn, Mg, Ta, Cr, W, Ru, Rh, Ir, Ni, Pd, Pt, and a transparent conductive oxide (TCO). The first electrode 296 and the second electrode 297 may be located in the same direction on a first surface of the light emitting structure 293, and the substrate 298 may be disposed on a second surface of the light emitting structure 293. The first electrode 296 and the second electrode 297 may be mounted on the second lead frame 220 and the third lead frame 230 of the package body 250 in the form of a flip-chip. In this case, light emitted from the active layer 293b may be discharged to an outside via the substrate 298.

As illustrated in FIG. 5, the fuse package 200 may be represented as an equivalent circuit in which the wire fuse 240 and the light emitting diode chip 290 are connected in series. Therefore, as described above, an EOS applied through an input terminal Vin may be blocked by the wire fuse 240. In other words, an EOS applied to the light emitting diode chip 290 may be blocked. The light emitting diode chip 290 may have a function of emitting light similar to the light emitting device package of the light emitting device module as described above, and further, may serve as an indicator to determine whether the fuse package is opened due to an EOS applied to the fuse package 200. In a case in which an EOS is applied to the fuse package 200, the light emitting diode chip 290 may be turned off, to visually indicate that an EOS has been applied.

In addition, the encapsulator may further include a wavelength conversion material such as a phosphor or a quantum dot. The wavelength conversion material may convert light emitted from the light emitting diode chip 290 into light having a specific wavelength. Here, the phosphor or the quantum dot may be mixed with a transparent liquid resin, to form the encapsulator. The transparent liquid resin may be one selected from the group consisting of a silicone-based resin, an epoxy-based resin, an acryl-based resin, a polymethyl methacrylate (PMMA) resin, mixtures thereof, and compounds thereof. The phosphor may be formed of a material for converting a wavelength of light into a yellow, a red, or a green wavelength, and the type of the phosphor may be determined by the wavelength of the light emitted from the light emitting diode chip 290. The phosphor may include at least one from among yttrium aluminum garnet (YAG)-based, terbium (aluminum garmet) TAG-based, silicate-based, sulfide-based, and nitride-based fluorescent materials. For example, when a phosphor converting a wavelength of light into yellow light is applied to a blue light emitting diode (LED) chip, white light may be obtained.

Figure 9:
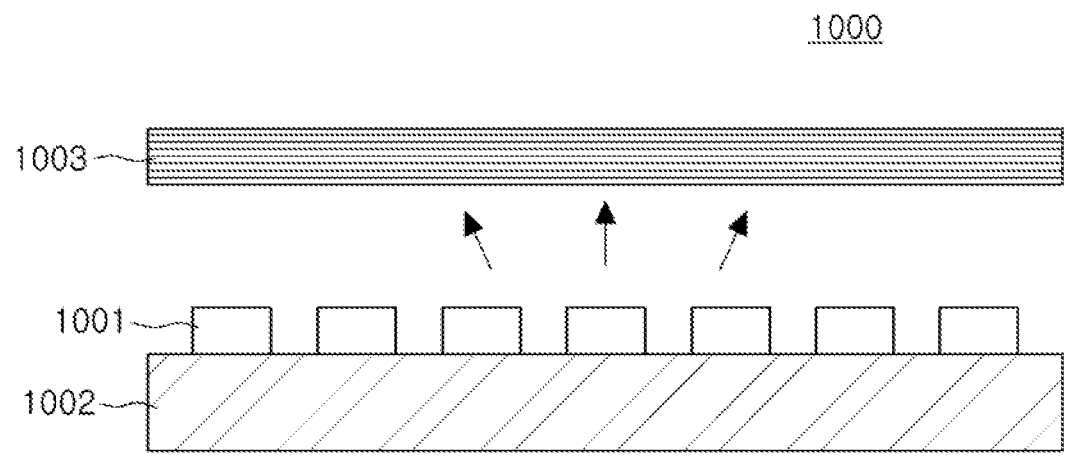
FIGS. 9 and 10 are examples of backlight units having a light emitting device module according to an exemplary embodiment.
Figure 10:
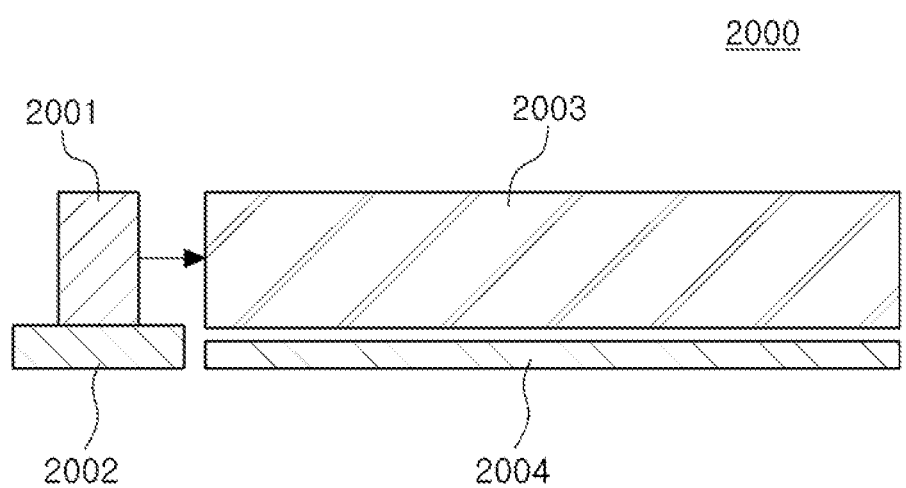

FIG. 9 and FIG. 10 are cross-sectional views illustrating backlight units to which a light emitting device module according to an exemplary embodiment is applied.

Referring to FIG. 9, a backlight unit 1000 may include light sources 1001 mounted on a substrate 1002 and one or more optical sheets 1003 disposed over the light sources 1001. As the light source 1001, a light emitting device package having the same structure as or similar structure to the light emitting device package 300 of FIG. 7 may be used. In addition, a light emitting diode chip may be directly mounted on the substrate 1002 (in a so-called chip on board (COB) type structure). At least one of the light sources 1001 may include the fuse package 100 of FIG. 7.

In FIG. 9, the light sources 1001 of the backlight unit 1000 radiate light upwardly toward a liquid crystal display device. On the other hand, in FIG. 10, a light source 2001 mounted on a substrate 2002 of a backlight unit 2000 radiates light in a lateral direction, such that the radiated light may be incident on a light guide panel 2003 to be converted into a surface light source. The light passing through the light guide panel 2003 may be discharged in an upper direction, and in order to improve light extraction efficiency, a reflective layer 2004 may be disposed below the light guide panel 2003.

Figure 11:
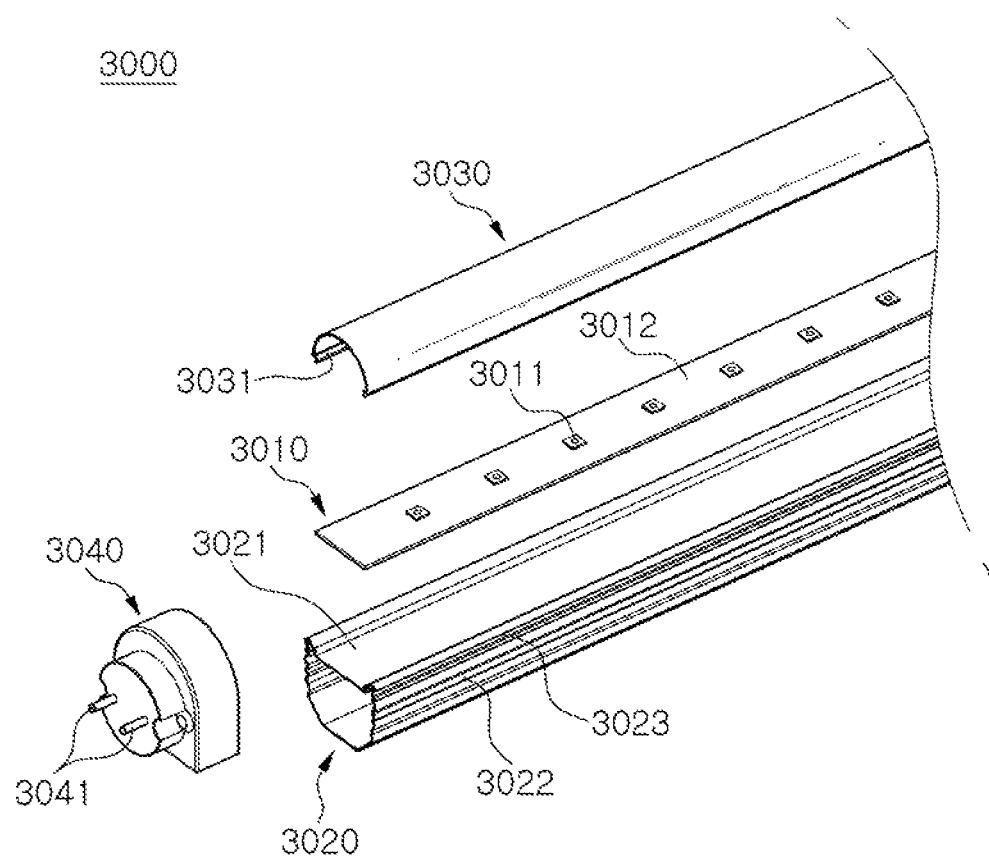
FIG. 11 is an example of a lighting device having a light emitting device module according to an exemplary embodiment.

FIG. 11 is a view illustrating an example of a lighting device employing a light emitting device module according to an exemplary embodiment.

Referring to FIG. 11, a lighting device 3000 may be, for example, a bar-type lamp and may include a light emitting device module 3010, a body 3020, a cover 3030 and a terminal 3040.

The light emitting device module 3010 may include a substrate 3012 and a plurality of light emitting device packages 3011 mounted on the substrate 3012. At least one of the light emitting device packages 3011 may have the same structure as or a similar structure to the light emitting device package 300 of FIG. 7. In addition, the light emitting device module 3010 may include the fuse package 100 of FIG. 7 that is formed on the substrate 3012.

The body 3020 may have a recess 3021 so that the light emitting device module 3010 is mounted on one surface thereof to be fixed thereto and heat generated by the light emitting device module 3010 may be discharged outwardly therefrom. For example, the body 3020 may include a heat sink as a supporting structure. A plurality of heat radiating fins 3022 for heat radiation may be formed on one or more side surfaces of the body 3020 to protrude therefrom.

The cover 3030 may be coupled to catching grooves 3023 of the body 3020 and may have a semicircular surface to enable light to be evenly discharged to an outside. Projection portions 3031 may be formed on a bottom portion of the cover 3030 in a length direction to engage with the catching grooves 3023 of the body 3020.

The terminal 3040 may be provided in at least one end portion of the body 3020 in a length direction thereof and may be used to supply power to the light emitting device module 3010. The terminal 3040 may include outwardly protruded electrode pins 3041.

Figure 12:
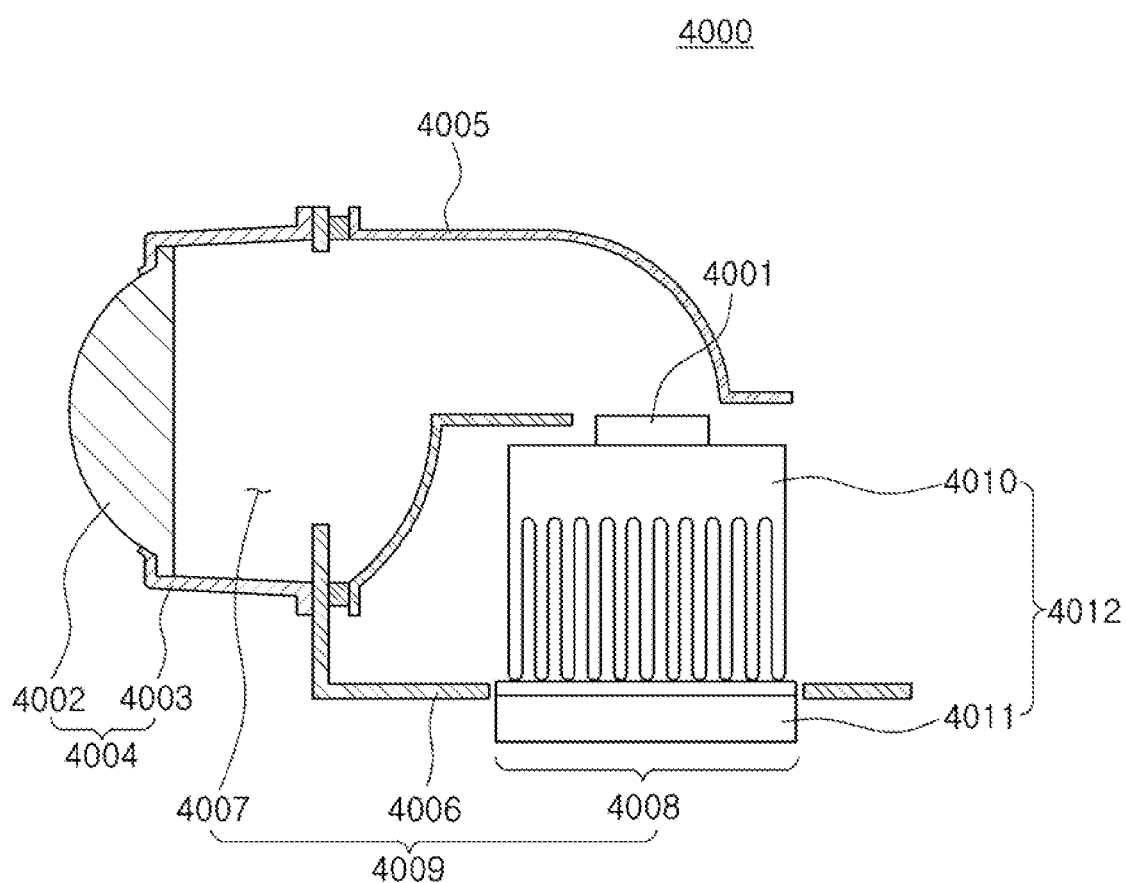
FIG. 12 is an example of a headlamp having a light emitting device module according to an exemplary embodiment.

FIG. 12 is a view illustrating an example of a headlamp employing a light emitting device module according to an exemplary embodiment.

Referring to FIG. 12, a headlamp 4000 that may be used as a vehicle lamp or the like may include a light source 4001, a reflector 4005, and a lens cover 4004. The lens cover 4004 may include a hollow guide 4003 and a lens 4002. The light source 4001 may include the light emitting device module according to an exemplary embodiment as described above.

The headlamp 4000 may further include a heat radiator 4012 which radiates heat generated by the light source 4001 to an outside. To effectively radiate heat, the heat radiator 4012 may include a heat sink 4010 and a cooling fan 4011. Also, the headlamp 4000 may further include a housing 4009 for fixing and supporting the heat radiator 4012 and the reflector 4005. The housing 4009 may have a body 4006 and a central hole 4008 formed on a first surface of the body 4006. The heat radiator 4012 may be coupled to the central hole 4008.

The housing 4009 may have a front hole 4007 formed at a second surface of the body 4006, which extends in a vertical direction from the first surface of the body 4006. The front hole 4007 may allow the reflector 4005 to be fixedly positioned above the light source 4001. The reflector 4005 is fixed to the housing 4009 such that a front side of the headlamp 4000 corresponds to the front hole 4007, and light reflected by the reflector 4005 may pass through the front hole 4007 to exit outwardly.

As set forth above, in a fuse package and a light emitting device module using the same according to exemplary embodiments, a current having a rated current value or more may be blocked so that damage to a light emitting device module is avoided.

Although a few embodiments have been shown and described, it would be appreciated by those skilled in the art that changes may be made in the exemplary embodiments without departing from the principles and spirit of the disclosure, the scope of which is defined in the claims and their equivalents.

What is claimed is:

1. A fuse package comprising:
    a first lead frame;
    a second lead frame spaced apart from the first lead frame;
    a package body configured to cover a portion of the first lead frame and a portion of the second lead frame;
    a wire fuse mounted on the first lead frame and the second lead frame, and configured to electrically connect the first lead frame and the second lead frame; and
    an encapsulator configured to cover the wire fuse,
    wherein the package body has a recess, and the wire fuse is disposed in the recess.

2. The fuse package of claim 1, further comprising:
    a light emitting diode chip mounted on the package body and electrically connected to the wire fuse in series.

3. The fuse package of claim 1, wherein the wire fuse comprises a material containing at least one selected from a group consisting of gold (Au), silver (Ag), and copper (Cu).

4. A light emitting device module comprising:
    a light emitting device string comprising a plurality of light emitting device packages that are connected to one another in series; and
    a fuse package connected to the light emitting device string in series,
    wherein the fuse package comprises a first lead frame, a second lead frame spaced apart from the first lead frame, a package body configured to cover a portion of the first lead frame and a portion of the second lead frame, a wire fuse mounted on the first lead frame and the second lead frame and configured to electrically connect the first lead frame and the second lead frame, and an encapsulator configured to cover the wire fuse,
    wherein the package body has a recess, and the wire fuse is disposed in the recess.

5. The light emitting device module of claim 4, wherein the wire fuse is wire bonded to the first lead frame and the second lead frame.

6. The light emitting device module of claim 4, wherein the fuse package is connected to an input terminal of the light emitting device string.

7. The light emitting device module of claim 4, further comprising:
    a light emitting diode chip mounted on the package body and electrically connected to the wire fuse in series.

8. The light emitting device module of claim 4, wherein the encapsulator comprises a material configured to convert a wavelength of light.

9. The light emitting device module of claim 4, wherein the wire fuse comprises a material containing at least one selected from a group consisting of gold (Au), silver (Au), and copper (Cu).

10. The light emitting device module of claim 4, wherein the plurality of the light emitting device packages comprises flip-chip packages.

11. The light emitting device module of claim 4, wherein the encapsulator comprises a light transmitting material.

12. The light emitting device module of claim 4, wherein the encapsulator comprises a material configured to convert a wavelength of light.

13. The light emitting device module of claim 4, wherein the wire fuse is wire bonded to the first lead frame and the second lead frame.

14. The light emitting device module of claim 4, wherein the wire fuse has a thickness ranging from about 0.8 mil to about 1.0 mil.

15. The light emitting device module of claim 4, wherein the wire fuse has a length ranging from about 500 μm to about 800 μm.

16. A lighting apparatus, comprising:
    a light emitting device module; and
    a body configured to accommodate the light emitting device module, wherein the light emitting device module comprises a circuit board on which a fuse package and a plurality of light emitting device packages are mounted, the fuse package and the plurality of light emitting device packages being electrically connected,
    wherein the fuse package comprises a wire fuse configured to be blown in response to a current having a predetermined current value or more being applied thereto,
    a first lead frame;
    a second lead frame spaced apart from the first lead frame;
    a package body configured to cover a portion of the first lead frame and a portion of the second lead frame;
    a wire fuse mounted on the first lead frame and the second lead frame, and configured to electrically connect the first lead frame and the second lead frame; and
    an encapsulator configured to cover the wire fuse,
    wherein the package body has a recess, and the wire fuse is disposed in the recess.

17. The lighting apparatus of claim 16, wherein the light emitting device module comprises a string of the plurality of light emitting device packages that are connected to one another in series,
   wherein the fuse package is connected in series to an input terminal of the light emitting device string.

18. The lighting apparatus of claim 16, wherein a portion of the wire fuse has an interval of about 140 μm to about 150 μm from the first lead frame and the second lead frame.

19. The lighting apparatus of claim 16, wherein the encapsulator comprises a transparent liquid resin, the transparent liquid resin comprising a resin selected from a group consisting of a silicone-based resin, an epoxy-based resin, an acryl-based resin, a polymethyl methacrylate (PMAA) resin, and a mixture thereof.

20. The fuse package of claim 2, further comprising:
   a third lead frame spaced apart from the first lead frame and the second lead frame, wherein the light emitting diode chip is mounted on the second lead frame and the third lead frame.

\* \* \* \* \*